(12) United States Patent
Shen et al.

(10) Patent No.: US 11,424,319 B2
(45) Date of Patent: Aug. 23, 2022

(54) MULTILAYER CAPACITOR ELECTRODE

(71) Applicant: Taiwan Semiconductor Manufacturing Co., Ltd., Hsin-Chu (TW)

(72) Inventors: Hsiang-Ku Shen, Hsinchu (TW); Dian-Hau Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/888,429

(22) Filed: May 29, 2020

(65) Prior Publication Data
US 2021/0376058 A1    Dec. 2, 2021

(51) Int. Cl.
*H01L 49/02* (2006.01)

(52) U.S. Cl.
CPC .............. *H01L 28/91* (2013.01); *H01L 28/40* (2013.01); *H01L 28/60* (2013.01); *H01L 28/75* (2013.01); *H01L 28/86* (2013.01); *H01L 28/90* (2013.01)

(58) Field of Classification Search
CPC ......... H01L 28/60; H01L 28/75; H01L 28/40; H01L 28/91; H01L 23/5223
See application file for complete search history.

(56) References Cited

U.S. PATENT DOCUMENTS

| | | | | |
|---|---|---|---|---|
| 6,344,964 B1* | 2/2002 | Adler | ....................... | H01L 28/55 361/306.3 |
| 7,282,404 B2* | 10/2007 | Coolbaugh | ......... | H01L 23/5223 257/296 |
| 10,615,112 B2* | 4/2020 | Li | ........................ | H01L 23/5223 |
| 11,043,456 B2* | 6/2021 | Park | .................... | H01L 23/5226 |
| 2016/0204190 A1* | 7/2016 | Chu | ......................... | H01L 28/75 257/532 |
| 2019/0148072 A1* | 5/2019 | Fox, III | ................... | H01L 28/92 361/301.4 |
| 2020/0006183 A1 | 1/2020 | Huang et al. | | |
| 2020/0135843 A1* | 4/2020 | Ding | ................... | H01L 21/0337 |

* cited by examiner

*Primary Examiner* — Jose R Diaz
(74) *Attorney, Agent, or Firm* — Haynes and Boone, LLP

(57) ABSTRACT

Semiconductor devices and methods of forming the same are provided. In one embodiment, a semiconductor device includes a contact feature in a first dielectric layer, a first passivation layer over the contact feature, a bottom conductor plate layer disposed over the first passivation layer and including a first plurality of sublayers, a second dielectric layer over the bottom conductor plate layer, a middle conductor plate layer disposed over the second dielectric layer and including a second plurality of sublayers, a third dielectric layer over the middle conductor plate layer, a top conductor plate layer disposed over the third dielectric layer and including a third plurality of sublayers, and a second passivation layer over the top conductor plate layer.

20 Claims, 13 Drawing Sheets

MULTILAYER CAPACITOR ELECTRODE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

As the geometry size of IC devices decreases, passive devices that require large surface areas are moved to back-end-of-line (BEOL) structures. Metal-Insulator-Metal (MIM) capacitors are among examples of such passive devices. A typical MIM capacitor includes multiple conductor plate layers that are insulated from one another by multiple dielectric layers. Conductor plate layers are formed of metal nitrides to prevent degradation due to contact with oxygen-containing dielectric layers. While being electrically conductive, metal nitrides are not as conductive as metals. Therefore, although existing MIM structures and the fabrication process thereof have been generally adequate for their intended purposes, they have not been entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
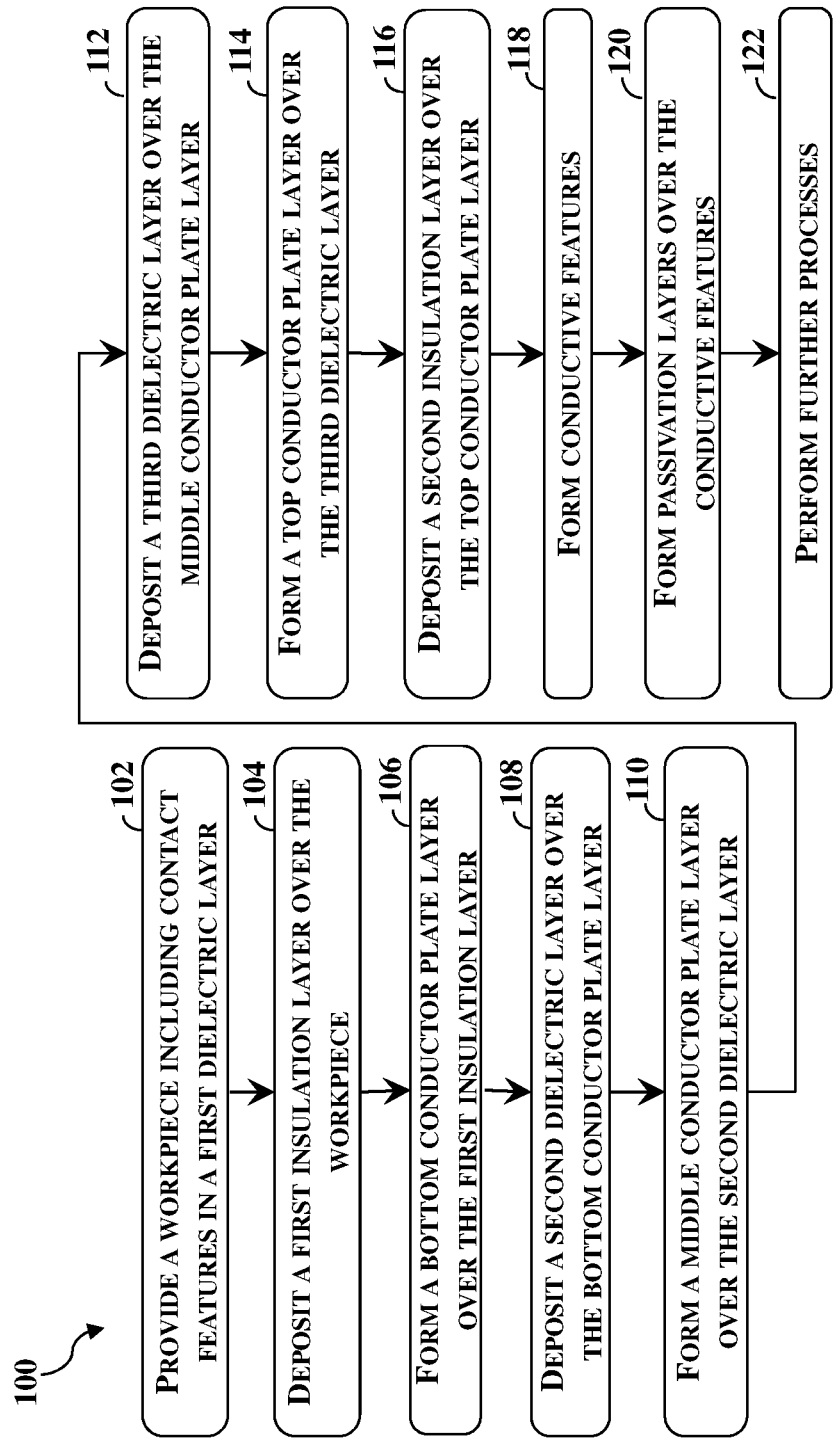
FIG. 1 is a flow chart of a method for fabricating a semiconductor device in accordance with embodiments of the present disclosure.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments, in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Metal-Insulator-Metal (MIM) capacitors have been widely used in functional circuits such as mixed signal circuits, analog circuits, Radio Frequency (RF) circuits, Dynamic Random Access Memories (DRAMs), embedded DRAMs, and logic operation circuits. In system-on-chip (SOC) applications, different capacitors for different functional circuits have to be integrated on a same chip to serve different purposes. For example, in mixed-signal circuits, capacitors are used as decoupling capacitors and high-frequency noise filters. For DRAM and embedded DRAM circuits, capacitors are used for memory storage, while for RF circuits, capacitors are used in oscillators and phase-shift networks for coupling and/or bypassing purposes. For microprocessors, capacitors are used for decoupling. As its name suggests, an MIM capacitor includes a sandwich structure of interleaving metal layers and insulator layers (i.e., dielectric layers). An example MIM capacitor includes a bottom conductor plate layer, a middle conductor plate layer over the bottom conductor plate layer, and a top conductor plate layer over the middle conductor plate, each of which is insulated from an adjacent conductor plate layer by a dielectric layer. As an MIM capacitor is fabricated in a BEOL structure to have a larger surface area, its conductor plate layers extend over multiple contact features. Contact vias may be formed through the conductor plate layers to electrically couple the contact features to one or more of the conductor plate layers. The contact vias may be electrically coupled to contact pads for connection to external circuitry.

Performance and attributes of an MIM capacitor may be modeled using a parallel plate capacitor that includes a dielectric material sandwiched between two parallel electrode plates. A parallel plate capacitance of such a parallel plate capacitor may be expressed as: $C = \varepsilon r * \varepsilon 0 * A/d$ where $\varepsilon r$ is the dielectric constant of the dielectric material, $\varepsilon 0$ is the dielectric constant of free space, A is the area of the parallel electrode plate, and d is the distance between the two parallel electrode plates. The capacitance of an MIM capacitor may thus be adjusted through an area of the conductor plates, the distance between conductor plates, and the dielectric constant of the dielectric layers between conductor plates. For application that requires frequent charging and discharging of an MIM capacitor, resistance of a series resistor also comes into play. A time constant (T) of a resistor-capacitor (RC) circuit that includes a series resistor having a series resistance (Rs) and a capacitor (C) may be expressed as: T=Rs*C. The time constant (T) represents the theoretical time to charge the capacitor to 63% of its total charge. For an MIM capacitor, resistance of its conductor plate layers is factored into the series resistance. When conductor plate layers of an MIM capacitor have lower resistance, the MIM capacitor has a smaller time constant, making it more suitable for high-frequency applications.

It follows that, in order to lower the time constant of an MIM capacitor, its conductor plate layers should be as electrically conductive as possible. Besides conductivity, there are other considerations. For example, each of the conductor plate layers should have good adhesion with adjacent dielectric materials that come in contact with it and is unlikely to be oxidized due to direct contact with these adjacent dielectric materials. Due to the foregoing considerations, metal nitrides, such as titanium nitride or tantalum nitride, have been used to form conductor plate layers. Metal nitrides adhere well to dielectric materials and are not susceptible to oxidation due to direct contact with oxygen-containing dielectric materials, such as silicon oxide. When it comes to conductivity, metal nitrides are conductive but not as conductive as metals.

The present disclosure provides a method and a semiconductor device to reduce the time constant of an MIM capacitor while maintaining the integrity of the conductor plate layers. In some embodiments, an MIM capacitor according to the present disclosure has multiple conductor plate layers and each of the conductor plate layers is a multilayer that includes at least a metal nitride layer and metal layer. In one embodiment, each of the conductor plate layers includes a metal layer sandwiched between a bottom metal nitride layer and a top metal nitride layer. The bottom and top metal nitride layers provide an oxygen atom barrier and the metal layer provides the desired conductivity. Processes of the present disclosure form the metal layer and metal nitride layer use the same metal target, such as titanium target or tantalum target. Due to the reduced time constant, MIM capacitors of the present disclosure are suitable high-frequency applications where MIM capacitors are frequently charged and discharged.

The various aspects of the present disclosure will now be described in more detail with reference to the figures. In that regard, FIG. 1 is a flowchart illustrating a method 100 for fabricating a semiconductor device according to embodiments of the present disclosure. The method 100 is merely an example and is not intended to limit the present disclosure to what is explicitly illustrated in the method 100. Additional steps can be provided before, during, and after the method 100, and some steps described can be replaced, eliminated, or moved around for additional embodiments of the method. Not all steps are described herein in detail for reasons of simplicity. The method 100 is described below in conjunction with FIGS. 2-13, which are fragmentary cross-sectional views of a workpiece at different stages of fabrication according to embodiments of the present disclosure.

Figure 2:
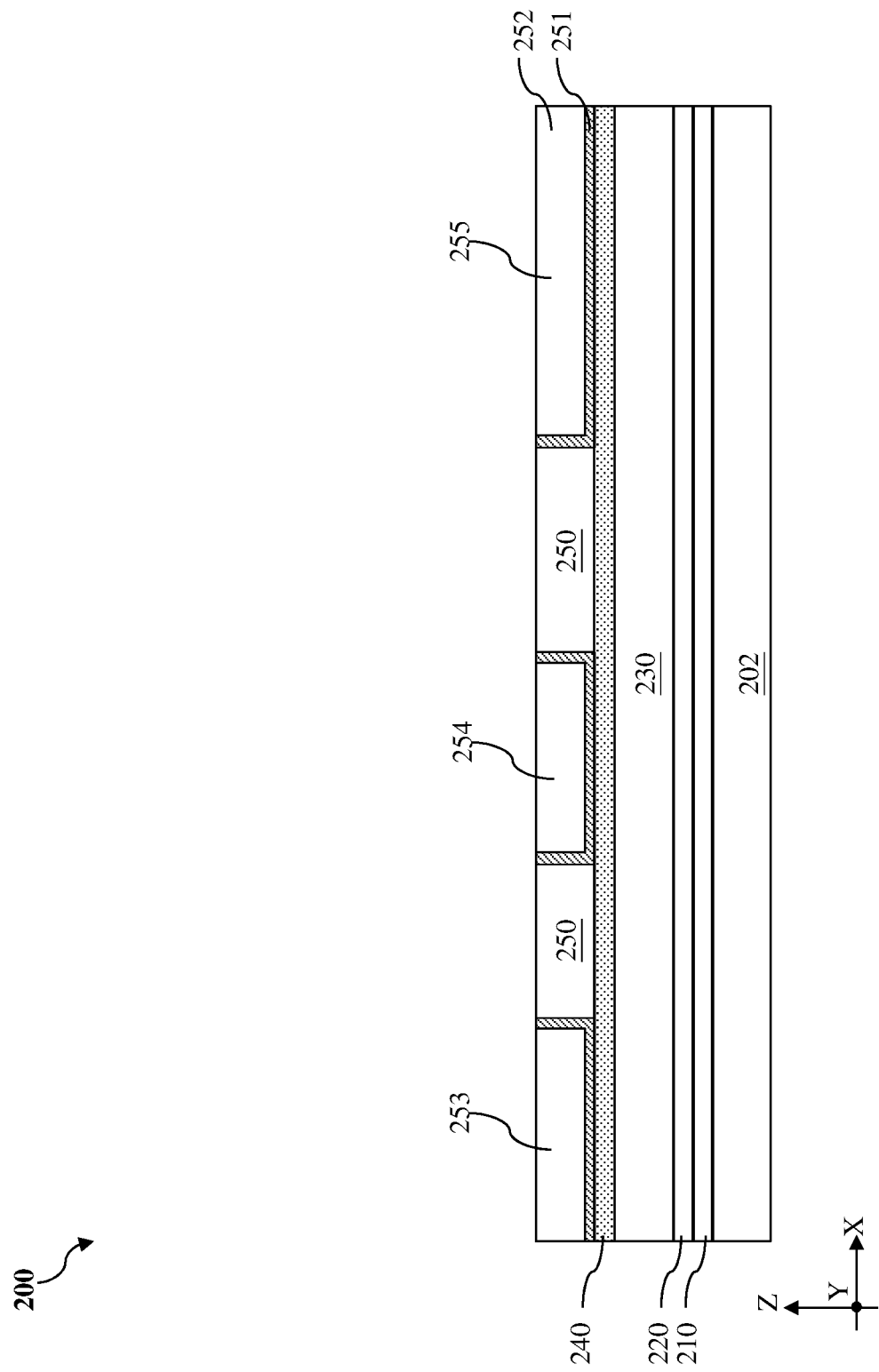
FIGS. 2-13 are cross-sectional views of a workpiece at various stages of fabrication according to embodiments of the present disclosure.

Referring to FIGS. 1 and 2, method 100 includes a block 102 where a workpiece 200 is provided. The workpiece 200 includes various layers already formed thereon. Because a semiconductor device will be formed from the workpiece 200, workpiece 200 may be referred to as semiconductor device 200 as the context requires. The workpiece 200 includes a substrate 202, which may be made of silicon or other semiconductor materials such as germanium. The substrate 202 also may include a compound semiconductor such as silicon carbide, gallium arsenic, indium arsenide, or indium phosphide. In some embodiments, the substrate 202 may include alloy semiconductor such as silicon germanium, silicon germanium carbide, gallium arsenic phosphide, or gallium indium phosphide. In some embodiments, the substrate 202 may include an epitaxial layer, for example an epitaxial layer overlying a bulk semiconductor. The substrate 202 may also be a silicon-on-insulator (SOI) substrate that includes an insulator layer. Various microelectronic components may be formed in or on the substrate 202, such as transistor components including source/drain features, gate structures, gate spacers, source/drain contacts, gate contacts, isolation structures including shallow trench isolation (STI), or any other suitable components.

The workpiece 200 also includes an interconnect layer 210. The interconnect layer 210 may be one of the interconnect layers in a multi-layered interconnect (MLI) structure, which is formed over the substrate 202 and may include multiple patterned dielectric layers and conductive layers that provide interconnections (e.g., wiring) between the various microelectronic components of the workpiece 200. There may be intermediate layers or components between the interconnect layer 210 and the substrate 202, but in the interest of simplicity such layers or components are not shown. In an embodiment, the interconnect layer 210 is about 169 to about 230 nanometers (nm) thick.

The interconnect layer 210 may include multiple conductive components as well as an interlayer dielectric (ILD) component that partially or fully surrounds the conductive components. The conductive components may include contacts, vias, or metal lines. The ILD component may be a silicon oxide or silicon oxide containing material where silicon exists in various suitable forms. As an example, the ILD component includes silicon oxide or a low-k dielectric material whose k-value (dielectric constant) is smaller than that of silicon oxide, which is about 4. In some embodiments, the low-k dielectric material includes a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, or combinations thereof.

The workpiece 200 may include a carbide layer 220 disposed on the interconnect layer 210, an oxide layer 230 disposed on the carbide layer, an etch stop layer (ESL) 240 disposed over the oxide layer 230. In some embodiments, the carbide layer 220 has a generally uniform thickness of between about 45 nm and about 70 nm. Any suitable type of carbide material such as silicon carbide (SiC) can be used in the carbide layer 220. In some embodiments, the oxide layer 230 may include silicon oxide. In an embodiment, the interconnect layer 210, the carbide layer 220 and the oxide layer 230 may be replaced with one or more interconnect structures. In some embodiments, the ESL 240 is about 45 nm to about 55 nm thick. The ESL 240 may include silicon carbonitride (SiCN), silicon oxycarbide (SiOC), silicon carbide (SiC), silicon oxycarbonitride (SiOCN), or silicon nitride (SiN), or combinations thereof.

As shown in FIG. 1, the workpiece 200 includes contact features 253, 254 and 255 in a first dielectric layer 250 disposed on the ESL 240. In some embodiments, the first dielectric layer 250 may be an undoped silica glass (USG)

layer and may include silicon oxide. In some implementations, the first dielectric layer 250 is about 800 to about 1000 nm thick. The contact features 253, 254 and 255 are surrounded by or embedded in the first dielectric layer 250. The contact features 253, 254, and 255 are sometimes referred to as top metal (TM) contacts because they may reside above transistor features (not shown in figures herein) to interface the MIM structure. Each of the contact features 253, 254, and 255 may include a barrier layer 251 and a metal fill layer 252. In some embodiments, the barrier layer 251 includes titanium nitride (TiN), tantalum (Ta), tantalum nitride (TaN), or combinations thereof. In some embodiments, the metal fill layer 252 includes a metal or metal alloy such as copper (Cu), cobalt (Co), nickel (Ni), aluminum (Al), tungsten (W), titanium (Ti), or combinations thereof.

Figure 3:
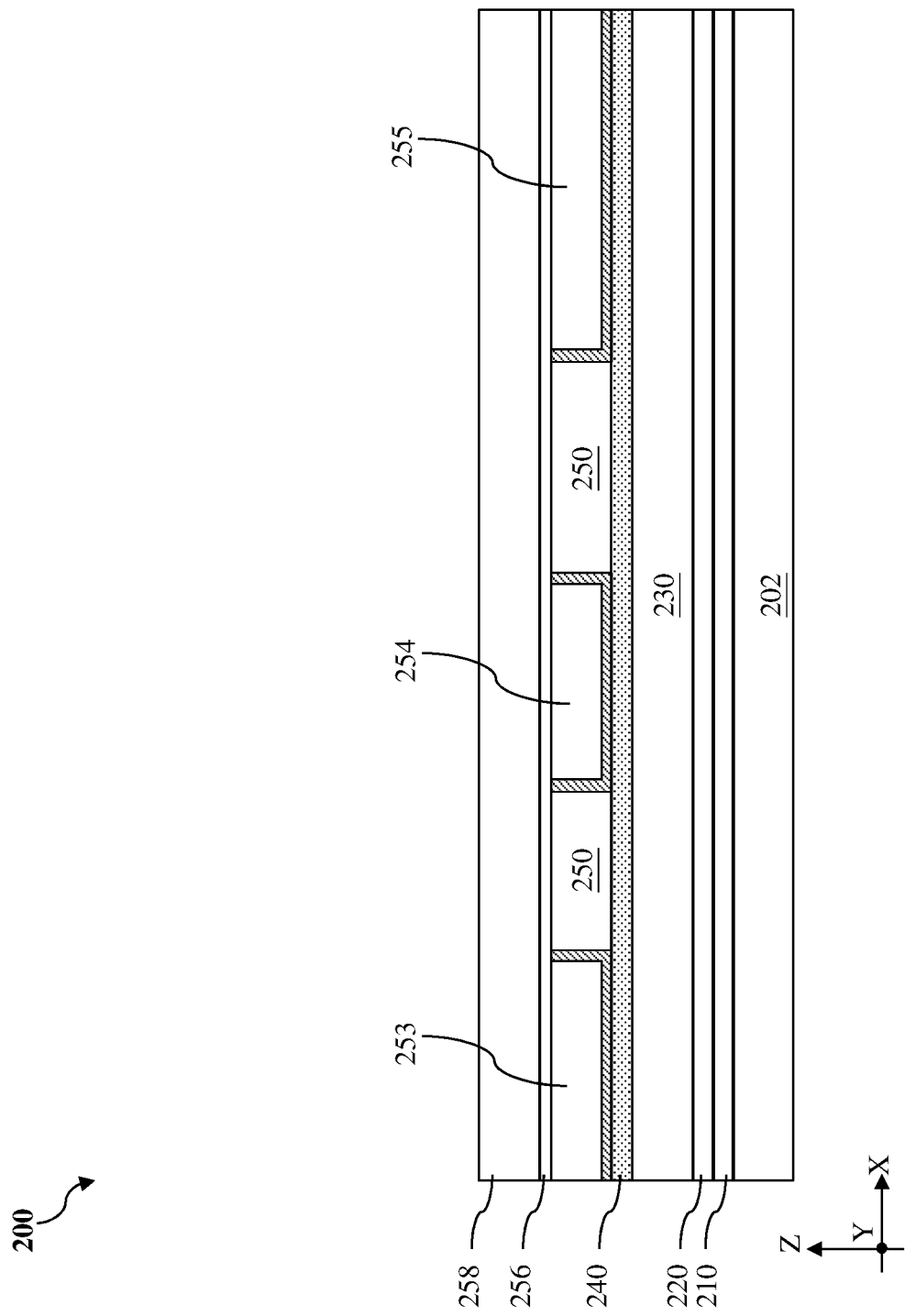

Referring to FIGS. 1 and 3, method 100 includes a block 104 where a first insulation layer 258 is deposited over the workpiece 200. The first insulation layer 258 may include silicon oxide and may be an undoped silica glass (USG) layer. In some embodiments, the first insulation layer 258 may be deposited using chemical vapor deposition (CVD) or subatmospheric CVD (SACVD). The first insulation layer 258 may have a thickness between about 400 nm and about 500 nm. In some implementations illustrated in FIG. 3, the workpiece 200 may further include a capping layer 256 between the contact features 253, 254 and 255 and the first insulation layer 258 and between the first dielectric layer 250 and the first insulation layer 258. In some embodiments, the capping layer 256 may include silicon carbonitride (SiCN) or silicon nitride (SiN). The capping layer 256 may be deposited using CVD and may be formed to a thickness between about 65 and about 85 nm. The capping layer 256 protects the contact features 253, 254, and 255 from being oxidized.

Figure 4:
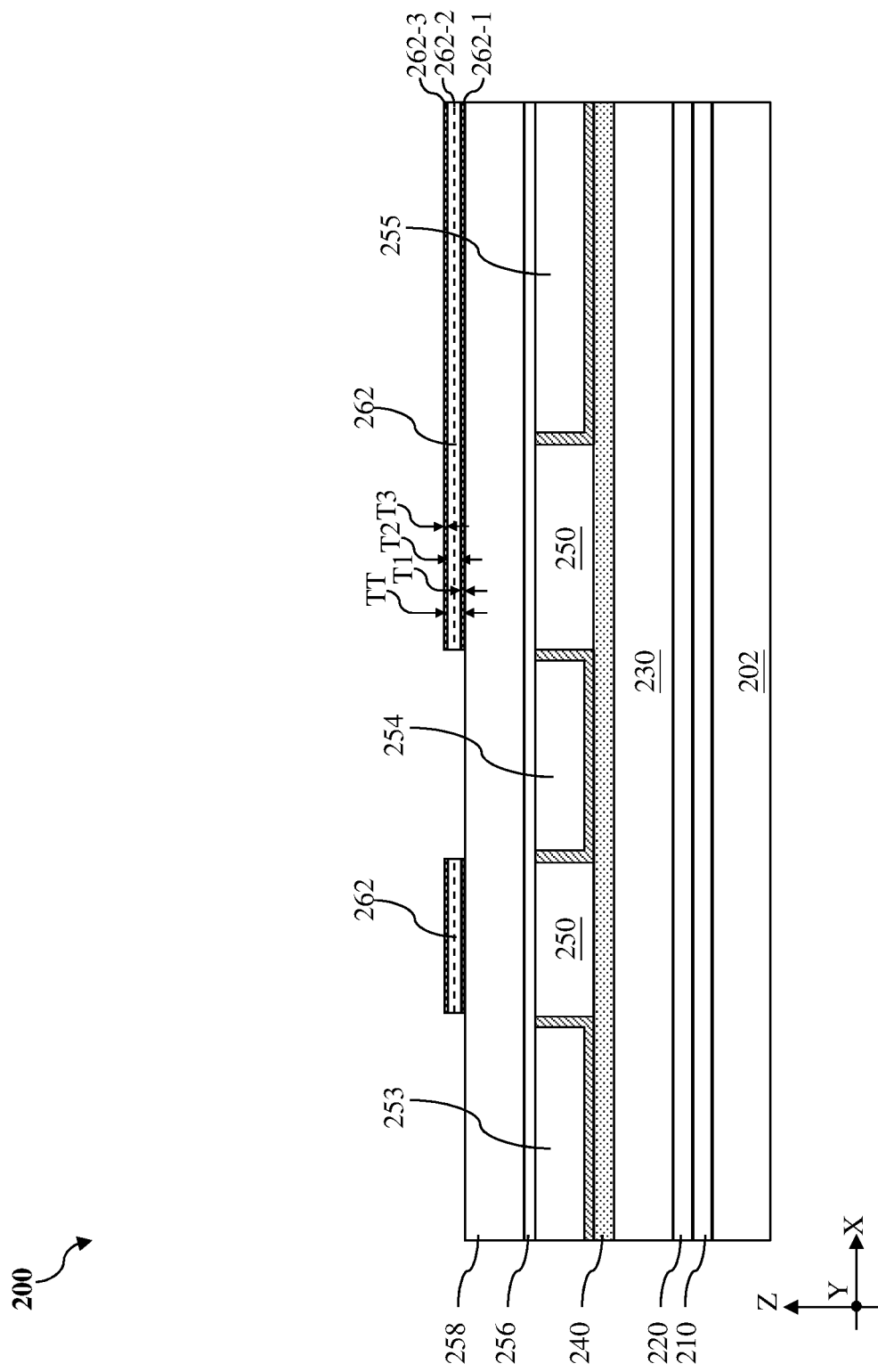

Referring to FIGS. 1 and 4, method 100 includes a block 106 where a bottom conductor plate layer 262 is formed over the first insulation layer 258. In some embodiments shown in FIG. 4, the bottom conductor plate layer 262 is a multilayer that includes multiple sublayers, including a first metal nitride layer 262-1, a first metal layer 262-2 over the first metal nitride layer 262-1, and a second metal nitride layer 262-3 over the first metal layer 262-2. The first metal nitride layer 262-1, the first metal layer 262-2 and the second metal nitride layer 262-3 may be formed using physical vapor deposition (PVD). In some implementations, the first metal nitride layer 262-1, the first metal layer 262-2 and the second metal nitride layer 262-3 include the same metal component, allowing them to be formed in-situ in the same PVD process chamber. In one example, the first metal layer 262-2 is formed of titanium (Ti) while the first metal nitride layer 262-1 and the second metal nitride layer 262-3 are formed of titanium nitride (TiN). In this example, the first metal nitride layer 262-1, the first metal layer 262-2 and the second metal nitride layer 262-3 may be deposited in the same PVD process chamber that includes a titanium (Ti) target. In another example, the first metal layer 262-2 is formed of tantalum (Ta) while the first metal nitride layer 262-1 and the second metal nitride layer 262-3 are formed of tantalum nitride (TaN). In this example, the first metal nitride layer 262-1, the first metal layer 262-2 and the second metal nitride layer 262-3 may be deposited in the same PVD process chamber that includes a tantalum (Ta) target.

The formation of the bottom conductor plate layer 262 may include deposition of the first metal nitride layer 262-1, deposition of the first metal layer 262-2, deposition of the second metal nitride layer 262-3, and patterning of the bottom conductor plate layer 262. The deposition of the first metal nitride layer 262-1 may be performed using a PVD process that includes a metal target, such as a titanium (Ti) target or a tantalum target (Ta), and a nitrogen-containing gas, such as ammonia ($NH_3$). The deposition of the first metal layer 262-2 may be performed using a PVD process that includes a metal target, such as a titanium (Ti) target or a tantalum target (Ta), and an inert gas, such as argon (Ar). The deposition of the second metal nitride layer 262-3 may be performed using a PVD process that includes a metal target, such as a titanium (Ti) target or a tantalum target (Ta), and a nitrogen-containing gas, such as ammonia ($NH_3$). The deposited first metal nitride layer 262-1, first metal layer 262-2 and second metal nitride layer 262-3 constitute a multilayer and are then patterned by photolithography and etch processes. Although not explicitly shown in FIG. 4, after the patterning of the bottom conductor plate layer 262, sidewalls of the bottom conductor plate layer 262 may be treated using nitrous oxide ($N_2O$) gas for passivation.

As shown in FIG. 4, the bottom conductor plate layer 262 has a total thickness TT, the first metal nitride layer 262-1 has a first thickness T1, the first metal layer 262-2 has a second thickness T2, and the second metal nitride layer 262-3 has a third thickness T3. The total thickness TT is the sum of the first thickness T1, the second thickness T2 and the third thickness T3. The first metal layer 262-2 is more conductive than the first metal nitride layer 262-1 and the second metal nitride layer 262-3. For example, when the first metal layer 262-2 is formed of titanium (Ti) and the first metal nitride layer 262-1 and the second metal nitride layer 262-3 are formed of titanium nitride (TiN), titanium (Ti) is about three times as conductive as titanium nitride (TiN). When the first metal layer 262-2 is formed of tantalum (Ta) and the first metal nitride layer 262-1 and the second metal nitride layer 262-3 are formed of tantalum nitride (TaN), tantalum (Ta) is about 5 times as conductive as tantalum nitride (TaN). Because the first metal layer 262-2 is more conductive than the first metal nitride layer 262-1 and the second metal nitride layer 262-3, the present disclosure maximizes the second thickness T2 of the first metal layer 262-2 while minimizing the first thickness T1 and the third thickness T3 to reduce series resistance (Rs) attributable to the bottom conductor plate layer 262. According to the present disclosure, the first metal nitride layer 262-1 and the second metal nitride layer 262-3 serve as conductive barrier layers to prevent oxygen from diffusing from adjacent dielectric layers, such as the first insulation layer 258 and the second dielectric layer 264 (shown in FIG. 5), into the first metal layer 262-2. In addition, the second metal nitride layer 262-3 protects the first metal layer 262-2 from being damaged or oxidized by plasma species generated during deposition of the second dielectric layer 264 (shown in FIG. 5). To adequately serve the conductive barrier functions, the first metal nitride layer 262-1 the second metal nitride layer 262-3 may not be too thin. In some instances, each of the first thickness T1 and the third thickness T3 may be between about 20 Å and about 40 Å. The total thickness TT of the bottom conductor plate layer 262 may be between about 350 Å and about 800 Å. The second thickness T2 may be between about 270 Å and about 760 Å.

In some alternative implementations, the first metal nitride layer 262-1, the first metal layer 262-2 and the second metal nitride layer 262-3 include the different metal components and are formed in different PVD process chambers. In these alternative implementations, the first metal nitride layer 262-1 and the second metal nitride layer 262-3 may be formed of titanium nitride (TiN) or tantalum nitride (TaN) while the first metal layer 262-2 may include copper (Cu), cobalt (Co), nickel (Ni), aluminum (Al), tungsten (W), tantalum (Ta), platinum (Pt), molybdenum (Mo), ruthenium (Ru), titanium (Ti), or any suitable metal that is more conductive than metal nitrides (e.g., titanium nitride or tantalum nitride). These alternative implementations may require moving the workpiece 200 in and out of at least two PVD process chambers. In an example when the first metal nitride layer 262-1 and the second metal nitride layer 262-3 are formed of titanium nitride (TiN) and the second metal layer 262-2 is formed of tungsten (W), the workpiece 200 is first placed in a first PVD chamber that includes a titanium (Ti) target and is in fluid communication with an ammonia ($NH_3$) source to form the first metal nitride layer 262-1. The workpiece 200 is then removed from the first PVD chamber and placed in a second PVD chamber that includes a tungsten (W) target and is in fluid communication with an inert gas source to form the first metal layer 262-2. Subsequently, the workpiece 200 is then removed from the second PVD chamber and placed again in the first PVD chamber to form the second metal nitride layer 262-3.

Figure 5:
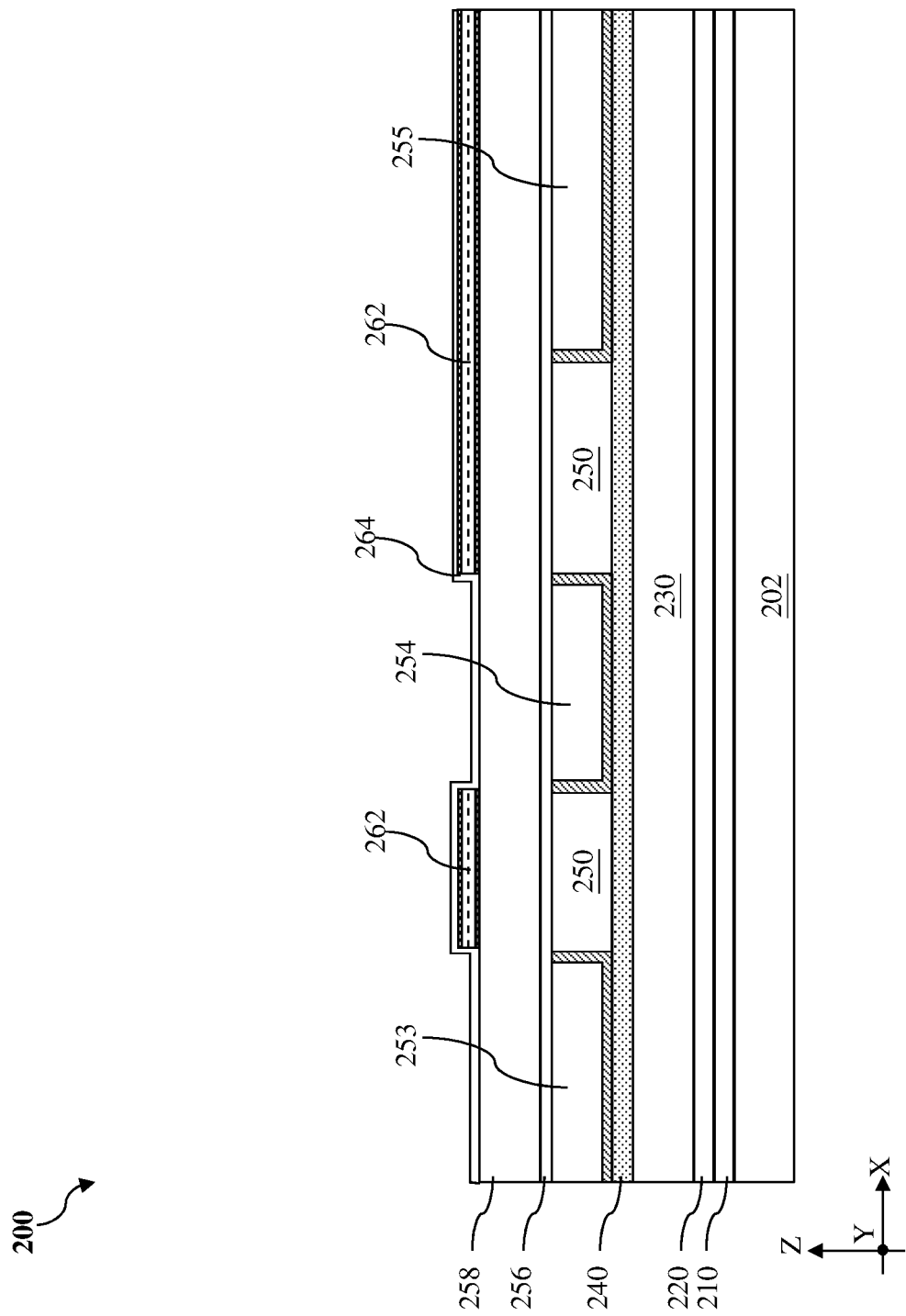

Referring to FIGS. 1 and 5, method 100 includes a block 108 where a second dielectric layer 264 is deposited over the bottom conductor plate layer 262. In some embodiments, to increase capacitance of the resulting MIM capacitor, the second dielectric layer 264 may include high-k dielectric material(s) whose k-value is greater than that of silicon oxide, which is about 3.9. In some instances, the second dielectric layer 264 may include hafnium oxide, zirconium oxide ($ZrO_2$), tantalum oxide ($Ta_2O_5$), aluminum oxide ($Al_2O_3$), or a combination thereof. The second dielectric layer 264 may be formed using CVD, metalorganic CVD (MOCVD), or atomic layer deposition (ALD). In some implementations, the second dielectric layer 264 may be deposited to have a generally uniform thickness over first insulation layer 258 and the bottom conductor plate layer 262. In some instances, the second dielectric layer 264 may have a thickness between about 50 nm and about 70 nm.

Figure 6:
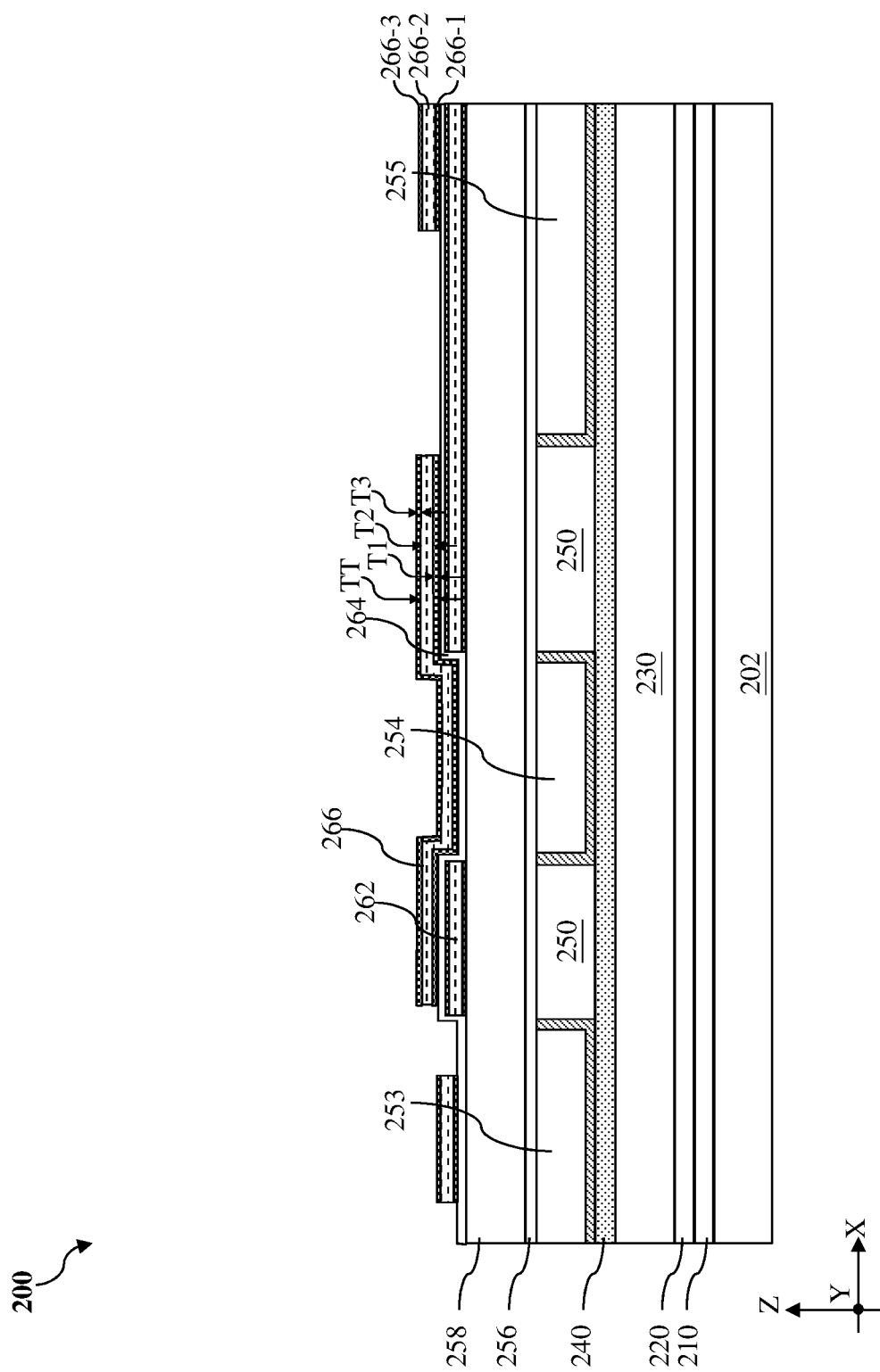

Referring to FIGS. 1 and 6, method 100 includes a block 110 where a middle conductor plate layer 266 over the second dielectric layer 264. In some embodiments shown in FIG. 6, the middle conductor plate layer 266 is a multilayer that includes multiple sublayers, including a third metal nitride layer 266-1, a second metal layer 266-2 over the third metal nitride layer 266-1, and a fourth metal nitride layer 266-3 over the second metal layer 266-2. The third metal nitride layer 266-1, the second metal layer 266-2 and the fourth metal nitride layer 266-3 may be formed using PVD. In some implementations, the third metal nitride layer 266-1, the second metal layer 266-2 and the fourth metal nitride layer 266-3 include the same metal component, allowing them to be formed in-situ in the same PVD process chamber. In one example, the second metal layer 266-2 is formed of titanium (Ti) while the third metal nitride layer 266-1 and the fourth metal nitride layer 266-3 are formed of titanium nitride (TiN). In this example, the third metal nitride layer 266-1, the second metal layer 266-2 and the fourth metal nitride layer 266-3 may be deposited in the same PVD process chamber that includes a titanium (Ti) target. In another example, the second metal layer 266-2 is formed of tantalum (Ta) while the third metal nitride layer 266-1 and the fourth metal nitride layer 266-3 are formed of tantalum nitride (TaN). In this example, the third metal nitride layer 266-1, the second metal layer 266-2 and the fourth metal nitride layer 266-3 may be deposited in the same PVD process chamber that includes a tantalum (Ta) target.

The formation of the middle conductor plate layer 266 may include deposition of the third metal nitride layer 266-1, deposition of the second metal layer 266-2, deposition of the fourth metal nitride layer 266-3 over the second metal layer 266-2, and patterning of the middle conductor plate layer 266. The deposition of the third metal nitride layer 266-1 may be performed using a PVD process that includes a metal target, such as a titanium (Ti) target or a tantalum target (Ta), and a nitrogen-containing gas, such as ammonia ($NH_3$). The deposition of the second metal layer 266-2 may be performed using a PVD process that includes a metal target, such as a titanium (Ti) target or a tantalum target (Ta), and an inert gas, such as argon (Ar). The deposition of the fourth metal nitride layer 266-3 may be performed using a PVD process that includes a metal target, such as a titanium (Ti) target or a tantalum target (Ta), and a nitrogen-containing gas, such as ammonia ($NH_3$). The deposited third metal nitride layer 266-1, second metal layer 266-2 and fourth metal nitride layer 266-3 constitute a multilayer and are then patterned by photolithography and etch processes. Although not explicitly shown in FIG. 5, after the patterning of the middle conductor plate layer 266, sidewalls of the middle conductor plate layer 266 may be treated using nitrous oxide ($N_2O$) gas for passivation.

As shown in FIG. 6, like the bottom conductor plate layer 262, the middle conductor plate layer 266 has the total thickness TT, the third metal nitride layer 266-1 has the first thickness T1, the second metal layer 266-2 has the second thickness T2, and the fourth metal nitride layer 266-3 has the third thickness T3. The total thickness TT is the sum of the first thickness T1, the second thickness T2 and the third thickness T3. The second metal layer 266-2 is more conductive than the third metal nitride layer 266-1 and the fourth metal nitride layer 266-3. For example, when the second metal layer 266-2 is formed of titanium (Ti) and the third metal nitride layer 266-1 and the fourth metal nitride layer 266-3 are formed of titanium nitride (TiN), titanium (Ti) is about three times as conductive as titanium nitride (TiN). When the second metal layer 266-2 is formed of tantalum (Ta), and the third metal nitride layer 266-1 and the fourth metal nitride layer 266-3 are formed of tantalum nitride (TaN), tantalum (Ta) is about 5 times as conductive as tantalum nitride (TaN). Because the second metal layer 266-2 is more conductive than the third metal nitride layer 266-1 and the fourth metal nitride layer 266-3, the present disclosure maximizes the second thickness T2 of the second metal layer 266-2 while minimizing the first thickness T1 and the third thickness T3 to reduce series resistance (Rs) attributable to the middle conductor plate layer 266. According to the present disclosure, the third metal nitride layer 266-1 and the fourth metal nitride layer 266-3 serve as conductive barrier layers to prevent oxygen from diffusing from adjacent dielectric layers, such as the second dielectric layer 264 and the third dielectric layer 268 (shown in FIG. 7), into the second metal layer 266-2. In addition, the fourth metal nitride layer 266-3 protects the second metal layer 266-2 from being damaged or oxidized by plasma species generated during deposition of the second dielectric layer 264 (shown in FIG. 5). To adequately serve the conductive barrier functions, the third metal nitride layer 266-1 the fourth metal nitride layer 266-3 may not be too thin. In some instances, each of the first thickness T1 and the third thickness T3 may be between about 20 Å and about 40 Å. The total thickness TT of the middle conductor plate layer 266 may be between about 350 Å and about 800 Å. The second thickness T2 may be between about 270 Å and about 760 Å.

In some alternative implementations, the third metal nitride layer 266-1, the second metal layer 266-2 and the fourth metal nitride layer 266-3 include the different metal components and are formed in different PVD process chambers. In these alternative implementations, the third metal nitride layer 266-1 and the fourth metal nitride layer 266-3 may be formed of titanium nitride (TiN) or tantalum nitride (TaN) while the second metal layer 266-2 may include copper (Cu), cobalt (Co), nickel (Ni), aluminum (Al), tungsten (W), tantalum (Ta), platinum (Pt), molybdenum (Mo), ruthenium (Ru), titanium (Ti), or any suitable metal that is more conductive than metal nitrides. As described above, these alternative implementations may require moving the workpiece 200 in and out of at least two PVD process chambers.

Figure 7:
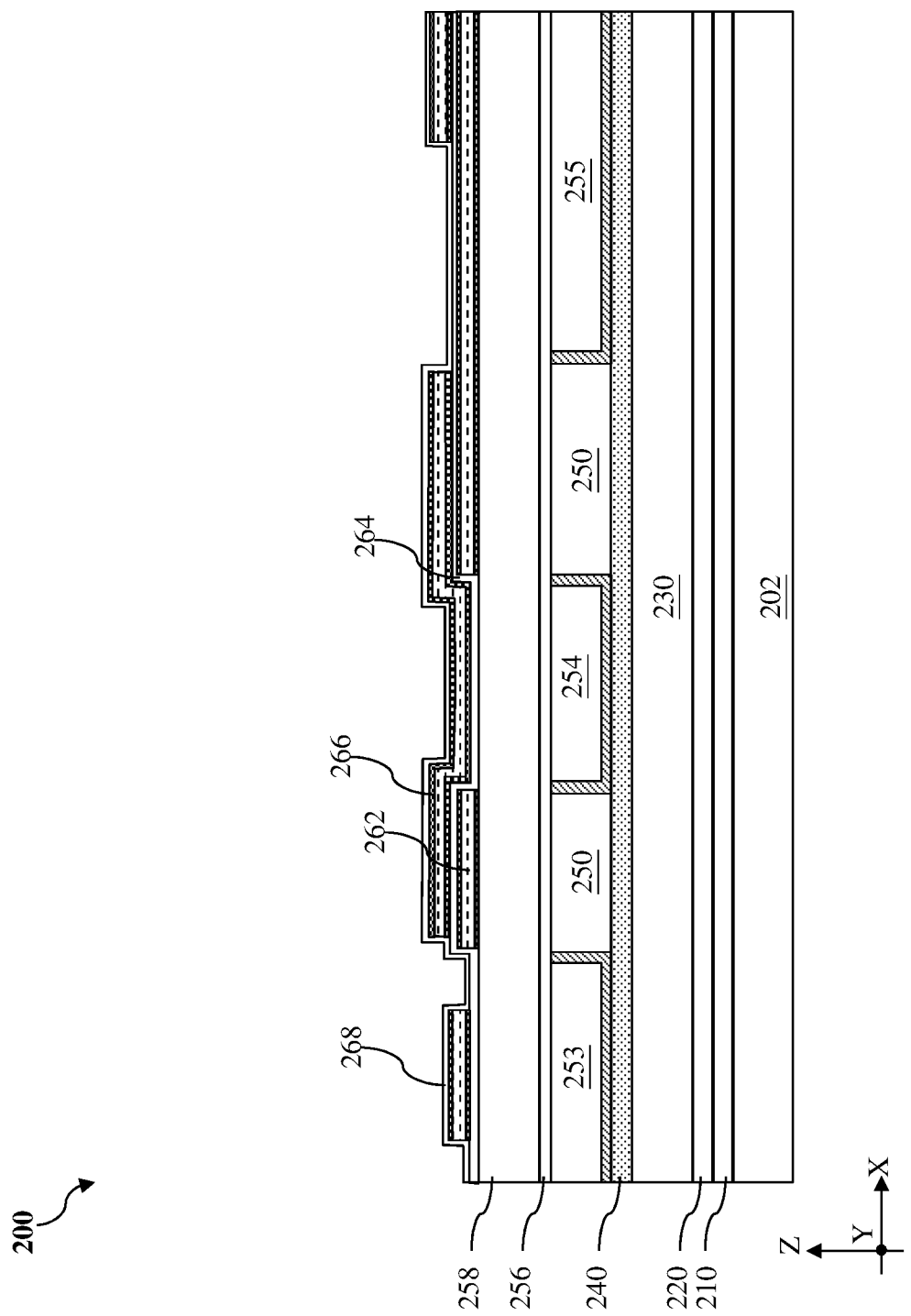

Referring to FIGS. 1 and 7, method 100 includes a block 112 where a third dielectric layer 268 is deposited over the middle conductor plate layer 266. In some embodiments, to increase capacitance of the resulting MIM capacitor, the third dielectric layer 268 may include high-k dielectric material(s) whose k-value is greater than that of silicon oxide, which is about 3.9. In some instances, the third dielectric layer 268 may include hafnium oxide, zirconium oxide ($ZrO_2$), tantalum oxide ($Ta_2O_5$), aluminum oxide ($Al_2O_3$), or a combination thereof. The second dielectric layer 264 may be formed using CVD, metalorganic CVD (MOCVD), or atomic layer deposition (ALD). In some implementations, the third dielectric layer 268 may be deposited to have a generally uniform thickness over second dielectric layer 264 and the middle conductor plate layer 266. In some instances, the third dielectric layer 268 may have a thickness between about 50 nm and about 70 nm.

Figure 8:
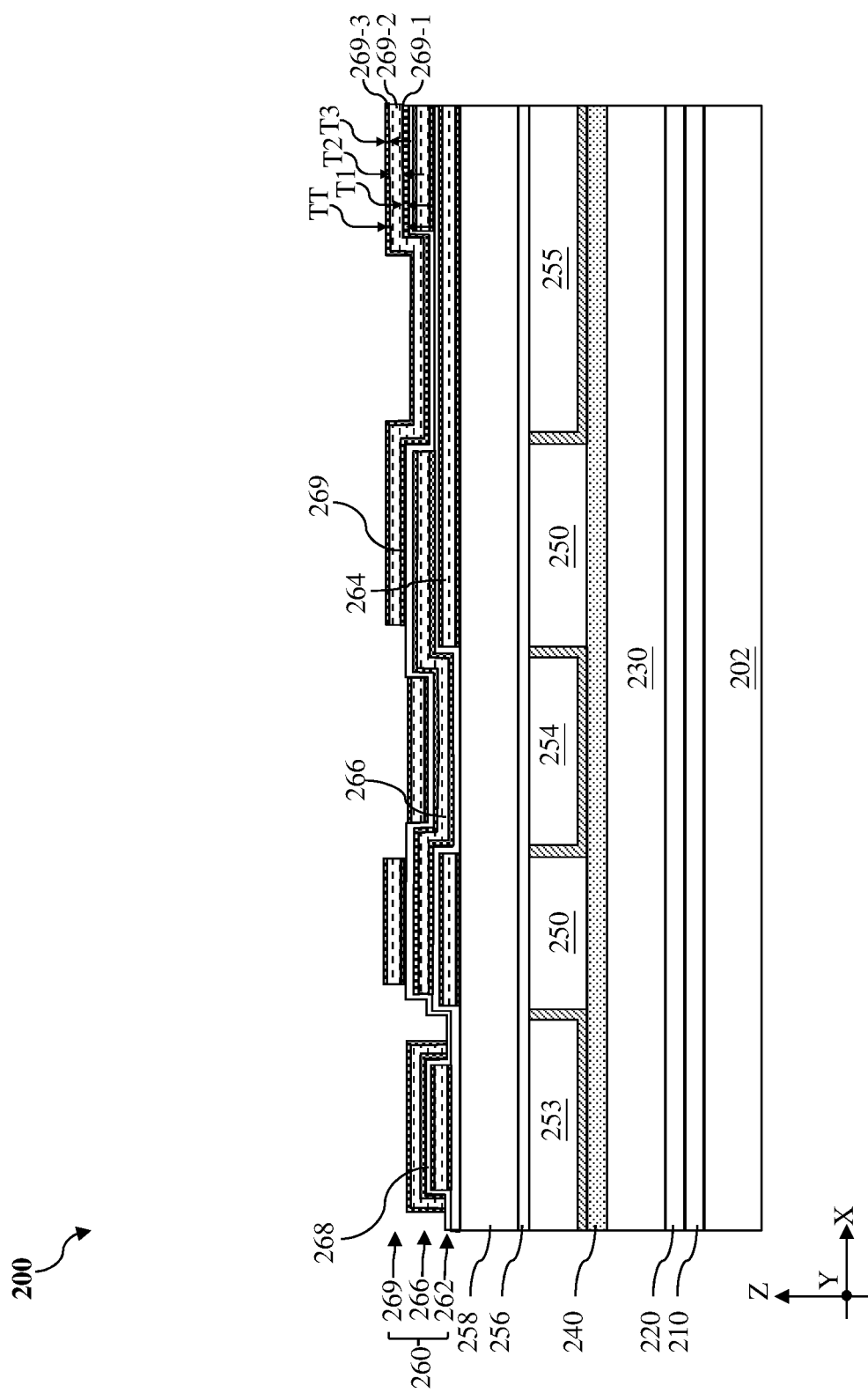

Referring to FIGS. 1 and 8, method 100 includes a block 114 where a top conductor plate layer 269 is deposited over the third dielectric layer 268. In some embodiments shown in FIG. 8, the top conductor plate layer 269 is a multilayer that includes multiple sublayers, including a fifth metal nitride layer 269-1, a third metal layer 269-2 over the fifth metal nitride layer 269-1, and a sixth metal nitride layer 269-3 over the third metal layer 269-2. The fifth metal nitride layer 269-1, the third metal layer 269-2 and the sixth metal nitride layer 269-3 may be formed using PVD. In some implementations, the fifth metal nitride layer 269-1, the third metal layer 269-2 and the sixth metal nitride layer 269-3 include the same metal component, allowing them to be formed in-situ in the same PVD process chamber. In one example, the third metal layer 269-2 is formed of titanium (Ti) while the fifth metal nitride layer 269-1 and the sixth metal nitride layer 269-3 are formed of titanium nitride (TiN). In this example, the fifth metal nitride layer 269-1, the third metal layer 269-2 and the sixth metal nitride layer 269-3 may be deposited in the same PVD process chamber that includes a titanium (Ti) target. In another example, the third metal layer 269-2 is formed of tantalum (Ta) while the fifth metal nitride layer 269-1 and the sixth metal nitride layer 269-3 are formed of tantalum nitride (TaN). In this example, the fifth metal nitride layer 269-1, the third metal layer 269-2 and the sixth metal nitride layer 269-3 may be deposited in the same PVD process chamber that includes a tantalum (Ta) target.

The formation of the top conductor plate layer 269 may include deposition of the fifth metal nitride layer 269-1, deposition of the third metal layer 269-2, deposition of the sixth metal nitride layer 269-3 over the third metal layer 269-2, and patterning of the top conductor plate layer 269. The deposition of the fifth metal nitride layer 269-1 may be performed using a PVD process that includes a metal target, such as a titanium (Ti) target or a tantalum target (Ta), and a nitrogen-containing gas, such as ammonia ($NH_3$). The deposition of the third metal layer 269-2 may be performed using a PVD process that includes a metal target, such as a titanium (Ti) target or a tantalum target (Ta), and an inert gas, such as argon (Ar). The deposition of the sixth metal nitride layer 269-3 may be performed using a PVD process that includes a metal target, such as a titanium (Ti) target or a tantalum target (Ta), and a nitrogen-containing gas, such as ammonia ($NH_3$). The deposited fifth metal nitride layer 269-1, third metal layer 269-2 and sixth metal nitride layer 269-3 constitute a multilayer and are then patterned by photolithography and etch processes. Although not explicitly shown in FIG. 8, after the patterning of the top conductor plate layer 269, sidewalls of the top conductor plate layer 269 may be treated using nitrous oxide ($N_2O$) gas for passivation.

As shown in FIG. 8, like the bottom conductor plate layer 262, the top conductor plate layer 269 has the total thickness TT, the fifth metal nitride layer 269-1 has the first thickness T1, the third metal layer 269-2 has the second thickness T2, and the sixth metal nitride layer 269-3 has the third thickness T3. The total thickness TT is the sum of the first thickness T1, the second thickness T2 and the third thickness T3. The third metal layer 269-2 is more conductive than the fifth metal nitride layer 269-1 and the sixth metal nitride layer 269-3. For example, when the third metal layer 269-2 is formed of titanium (Ti) and the fifth metal nitride layer 269-1 and the sixth metal nitride layer 269-3 are formed of titanium nitride (TiN), titanium (Ti) is about three times as conductive as titanium nitride (TiN). When the third metal layer 269-2 is formed of tantalum (Ta) and the fifth metal nitride layer 269-1 and the sixth metal nitride layer 269-3 are formed of tantalum nitride (TaN), tantalum (Ta) is about 5 times as conductive as tantalum nitride (TaN). Because the third metal layer 269-2 is more conductive than the fifth metal nitride layer 269-1 and the sixth metal nitride layer 269-3, the present disclosure maximizes the second thickness T2 of the third metal layer 269-2 while minimizing the first thickness T1 and the third thickness T3 to reduce series resistance (Rs) attributable to the top conductor plate layer 269. According to the present disclosure, the fifth metal nitride layer 269-1 and the sixth metal nitride layer 269-3 serve as conductive barrier layers to prevent oxygen from diffusing from adjacent dielectric layers, such as the third dielectric layer 268 and the second insulation layer 267 (shown in FIG. 9), into the third metal layer 269-2. In addition, the sixth metal nitride layer 269-3 protects the third metal layer 269-2 from being damaged or oxidized by plasma species generated during deposition of the second insulation layer 267 (shown in FIG. 9). To adequately serve the conductive barrier functions, the fifth metal nitride layer 269-1 the sixth metal nitride layer 269-3 may not be too thin. In some instances, each of the first thickness T1 and the third thickness T3 may be between about 20 Å and about 40 Å. The total thickness TT of the top conductor plate layer 269 may be between about 350 Å and about 800 Å. The second thickness T2 may be between about 270 Å and about 760 Å.

In some alternative implementations, the fifth metal nitride layer 269-1, the third metal layer 269-2 and the sixth metal nitride layer 269-3 include the different metal components and are formed in different PVD process chambers. In these alternative implementations, the fifth metal nitride layer 269-1 and the sixth metal nitride layer 269-3 may be formed of titanium nitride (TiN) or tantalum nitride (TaN) while the third metal layer 269-2 may include copper (Cu), cobalt (Co), nickel (Ni), aluminum (Al), tungsten (W), tantalum (Ta), platinum (Pt), molybdenum (Mo), ruthenium (Ru), titanium (Ti), or any suitable metal that is more conductive than metal nitrides. As described above, these alternative implementations may require moving the workpiece 200 in and out of at least two PVD process chambers.

At the conclusion of the operations at block 114, an MIM structure 260 is formed. The MIM structure 260 includes the bottom conductor plate layer 262, the second dielectric layer 264, the middle conductor plate layer 266, the third dielectric layer 268, and the top conductor plate layer 269. The MIM structure 260 may also be referred to as an MIM capacitor 260.

Figure 9:
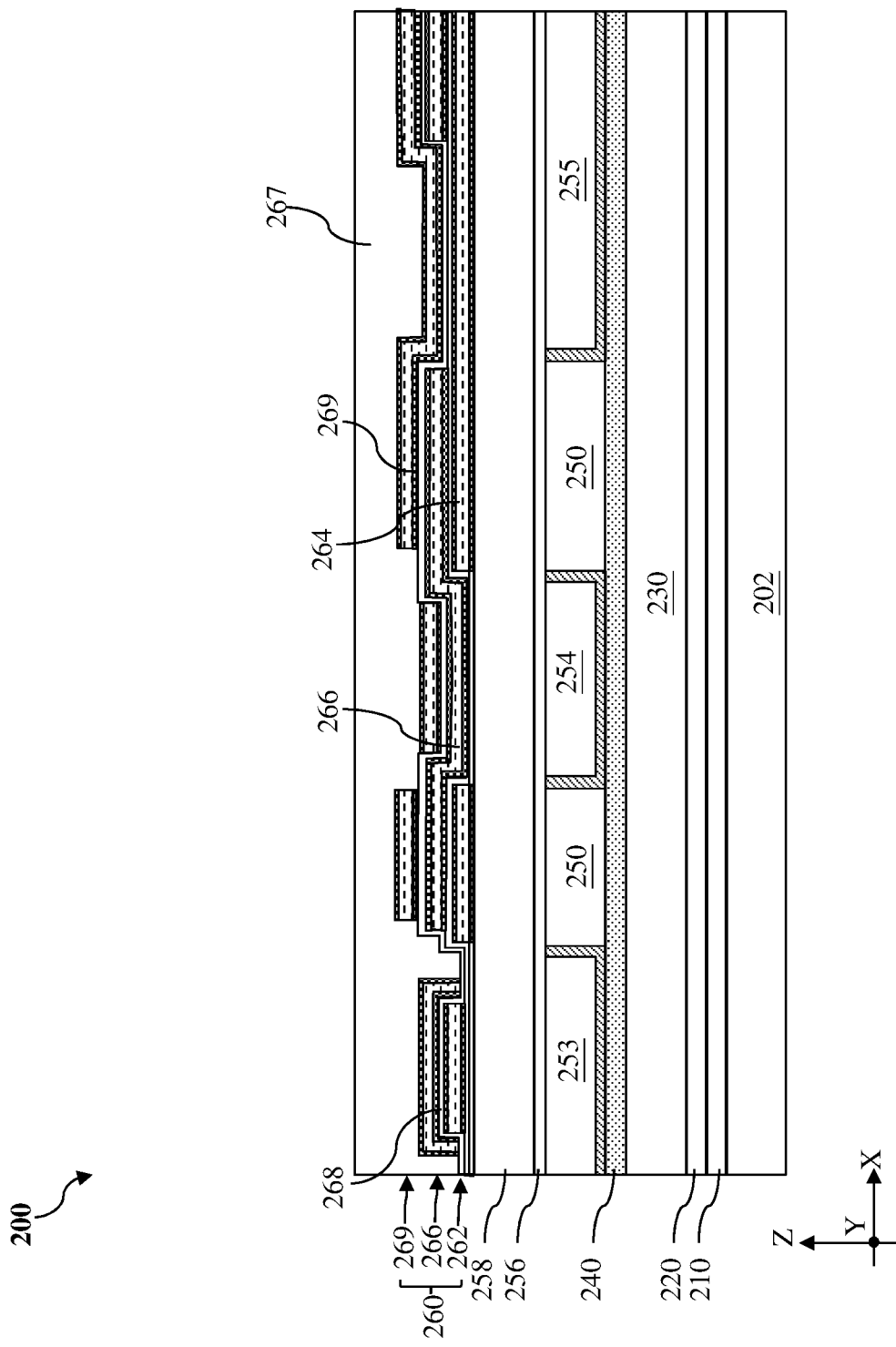

Referring to FIGS. 1 and 9, method 100 includes a block 116 where a second insulation layer 267 is deposited over the top conductor plate layer 269. In some embodiments, the second insulation layer 267 may be an undoped silica glass (USG) layer and may include silicon oxide. In some embodiments, the second insulation layer 267 may be about 400 nm to about 500 nm thick. In some embodiments, the second insulation layer 267 is formed by blanketly depositing about 900 to about 1000 nm thick of the oxide material (e.g., USG) to cover the topography of the MIM structure 260, followed by a chemical mechanical polishing (CMP) process to reach the final thickness of the second insulation layer 267. The deposition of the second insulation layer 267 may be performing using CVD or SACVD. As shown in FIG. 9, the MIM structure 260 is sandwiched between the first insulation layer 258 and the second insulation layer 267, which may have the same material and/or the same thickness.

Figure 10:
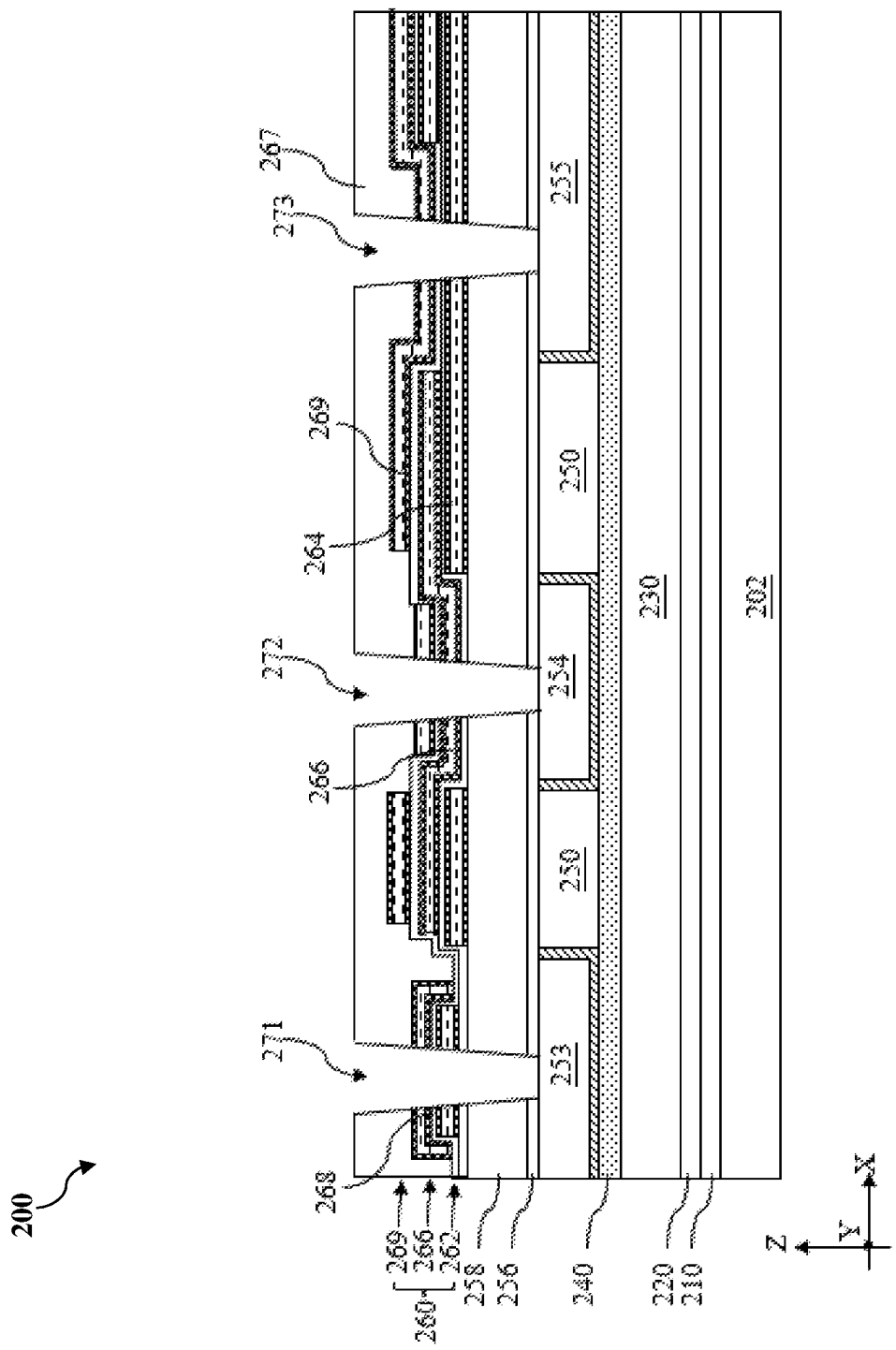
Figure 11:
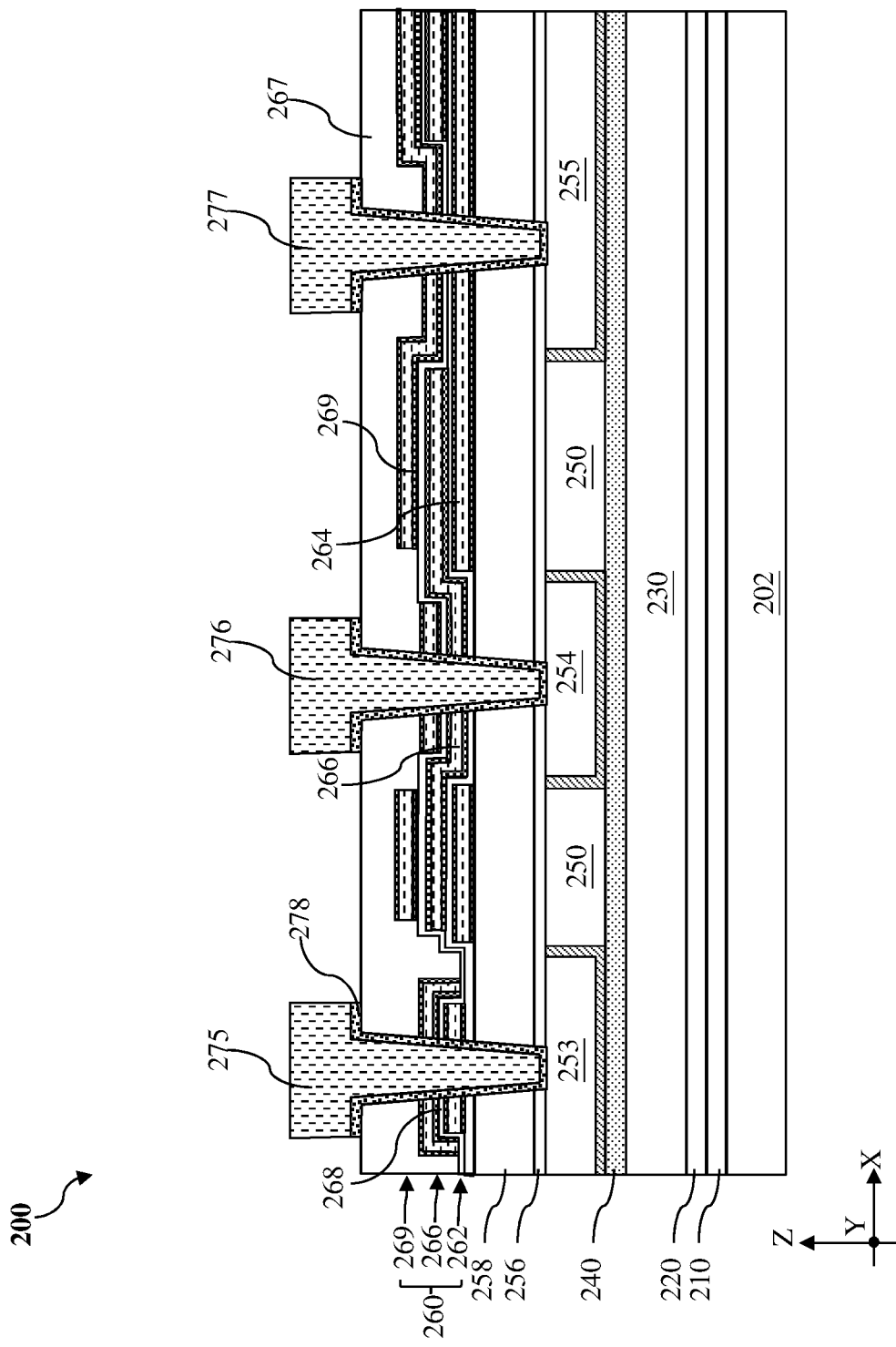

Referring to FIGS. 1, 10 and 11, method 100 includes a block 118 where conductive features 275, 276 and 277 are formed. As shown in FIGS. 10 and 11, block 118 includes formation of openings through the second insulation layer 267, the MIM structure 260, and the first insulation layer 258 and deposition of barrier layers and metal fill layers to form the conductive features in the openings. Referring to FIG. 10, one or more openings (such as openings 271, 272, and 273) are formed to penetrate through, from top to bottom, the second insulation layer 267, the MIM structure 260, the first insulation layer 258, and the capping layer 256. The openings 271, 272, and 273 expose top surfaces of the contact features 253, 254, and 255, respectively. In some embodiments, a dry etching process is performed to form the openings 271, 272, and 273. Depending on the application, the sidewall of each opening may expose different conductor plate layers of the MIM structure 260. As illustrated in FIG. 10, the opening 271 exposes sidewalls of the middle conductor plate layer 266 and the top conductor plate layer 269. The opening 272 exposes sidewalls of the top conductor plate layer 269 and the middle conductor plate layer 266. The opening 273 exposes sidewalls of the top conductor plate layer 269 and the bottom conductor plate layer 262.

Referring to FIG. 11, one or more conductive features (such as 275, 276, and 277) are formed in and over the openings 271, 272, and 273, respectively. The conductive features 275, 276, and 277 include contact vias that fill the openings 271, 272 and 273 and may be referred to as contact via, metal vias, or metal lines. In some embodiments, to form the one or more conductive features (such as 275, 276 and 277), a barrier layer 278 is first conformally deposited over the second insulation layer 267 and into the openings 271, 272 and 273 using a suitable deposition technique, such as atomic layer deposition (ALD), physical vapor deposition (PVD) or chemical vapor deposition (CVD) and then a metal fill layer is deposited over the barrier layer 278 using a suitable deposition technique, such as ALD, PVD or ALD. The deposited barrier layer 278 and the metal fill layer are then patterned to form conductive features 275, 276 and 277, as illustrated in the example in FIG. 11. In some embodiments, the barrier layer 278 may include titanium nitride (TiN), tantalum nitride (TaN), or tantalum (Ta) and the metal fill layer may include copper (Cu), cobalt (Co), nickel (Ni), aluminum (Al), tungsten (W), titanium (Ti), or combinations thereof.

Figure 12:
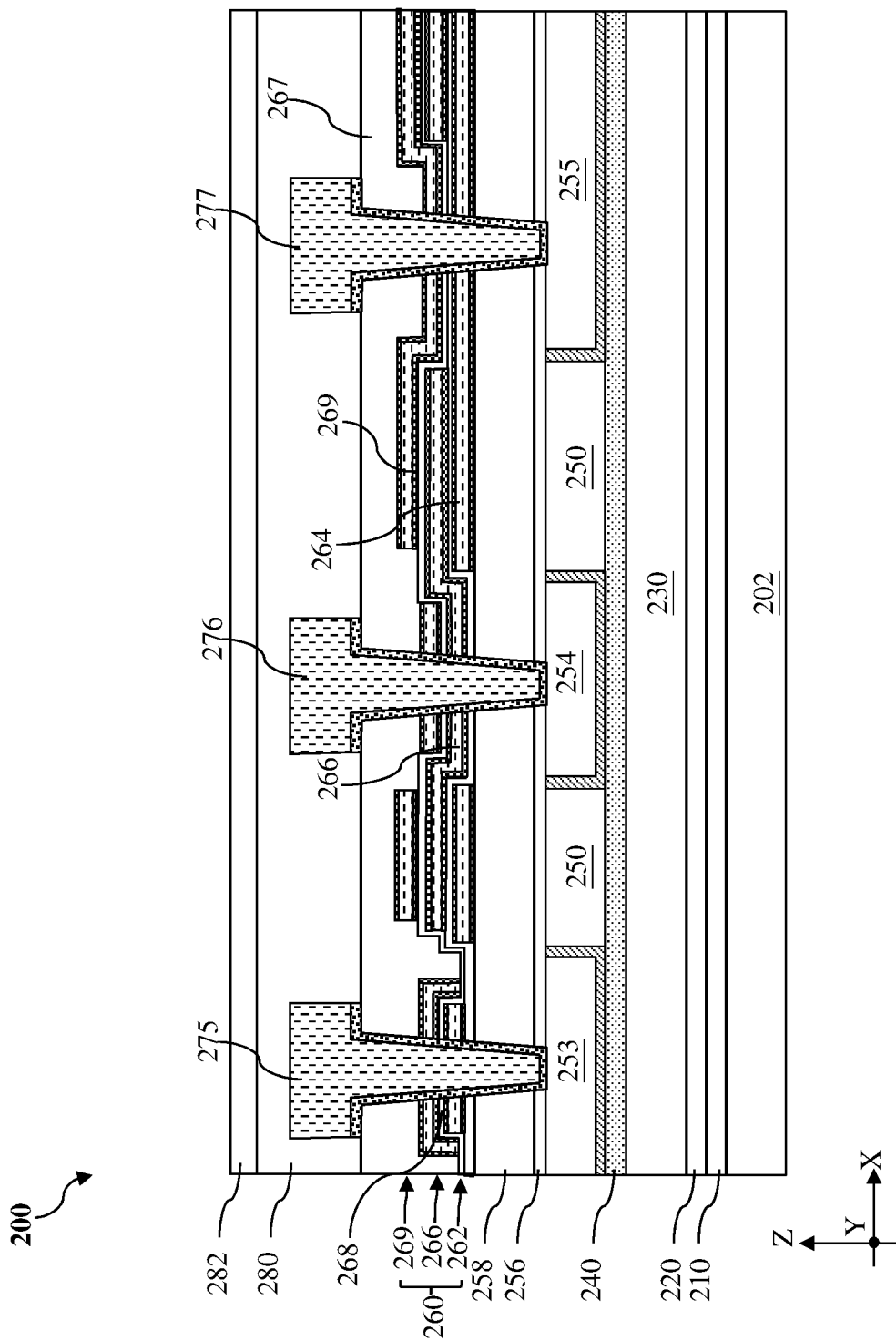

Referring to FIGS. 1 and 12, method 100 includes a block 120 where passivation layers are deposited the conductive features 275, 276 and 277. As shown in FIG. 12, a first passivation layer 280 is deposited over the workpiece 200, including over the conductive features 275, 276, and 277 and the second insulation layer 267. In some embodiments, the first passivation layer 280 may include one or more plasma-enhanced CVD (PECVD) oxide layers, one or more undoped silica glass (USG) layers, or a combination thereof. The first passivation layer 280 may be formed using CVD, spin-on coating, or other suitable technique. In some implementations, the first passivation layer 280 may be formed to a thickness between about 1000 nm and about 1400 nm, including 1200 nm. A second passivation layer 282 is then deposited over the first passivation layer 280. In some embodiments, the second passivation layer 282 may include silicon nitride (SiN) and may be formed by CVD, PVD or a suitable method to a thickness between about 600 nm and about 800 nm, including 700 nm.

Figure 13:
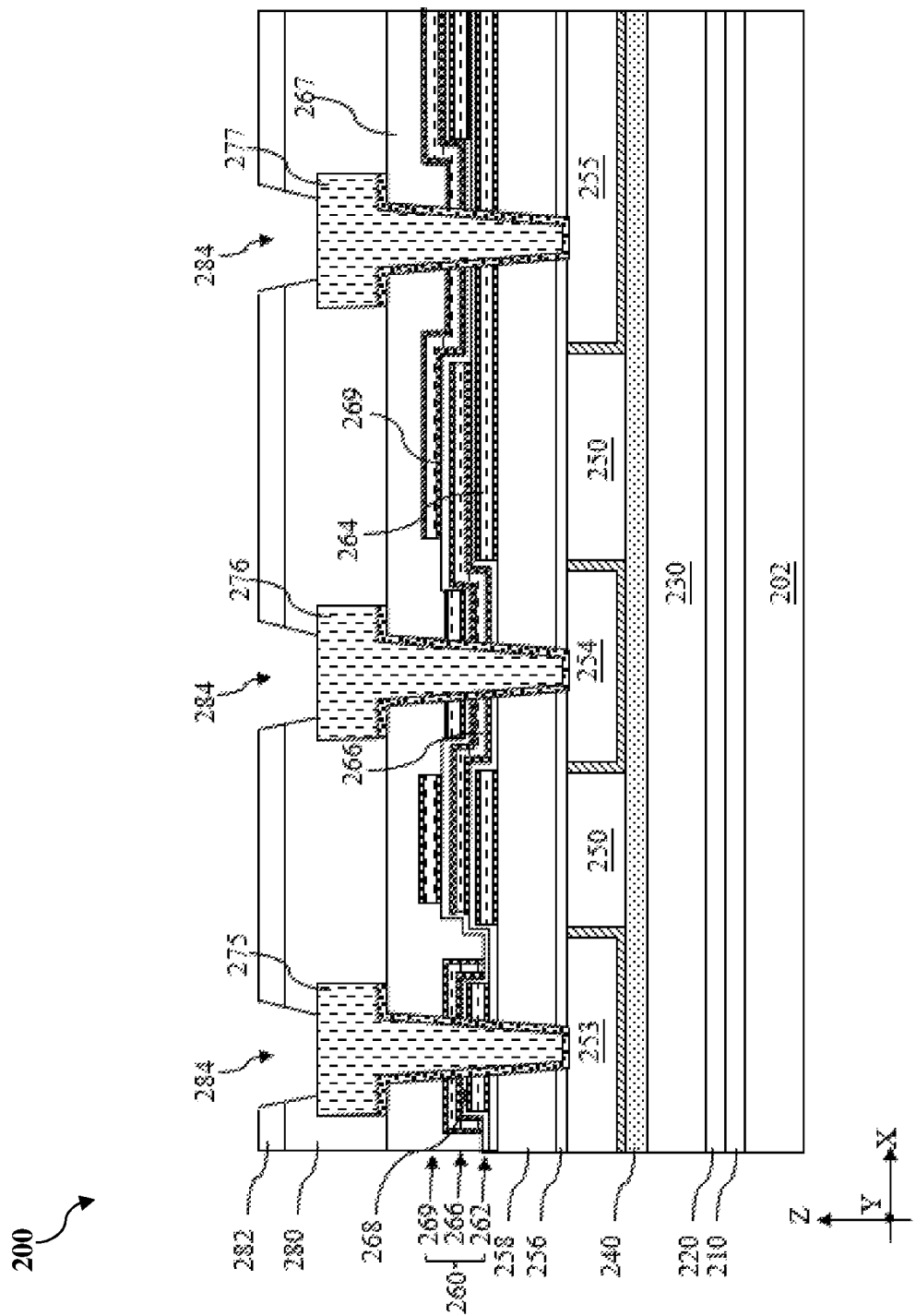

Referring to FIGS. 1 and 13, method 100 includes a block 122 where further processes are performed. Such further processes may include formation of the openings 284 through the first passivation layer 280 and the second passivation layer 282, deposition of one or more polymeric material layers, patterning of the one or more polymeric material layers, deposition of an under-bump-metallurgy (or under-bump-metallization, UBM) layer, deposition of a copper-containing bump layer, deposition of a cap layer, deposition of a solder layer, and reflowing of the solder layer. These further processes form contact structures for connection to external circuitry.

Methods and semiconductor devices according to the present disclosure provide advantages. For example, an MIM capacitor according to present disclosure includes multilayer conductor plate layers. Each of the conductor plate layers includes a metal layer sandwiched between two metal nitride layers. The metal layer provides increased conductivity while the metal nitride layers protect the metal layer from being oxidized due to contact with oxygen-containing dielectric layers. The lower resistance of the multilayer conductor plate layers reduces the time constant of the MIM capacitor, making them suitable for high-frequency applications.

One aspect of the present disclosure involves a semiconductor device. The semiconductor device includes a contact feature in a first dielectric layer, a first passivation layer over the contact feature, a bottom conductor plate layer over the first passivation layer, the bottom conductor plate layer including a first plurality of sublayers, a second dielectric layer over the bottom conductor plate layer, a middle conductor plate layer over the second dielectric layer, the middle conductor plate layer including a second plurality of sublayers, a third dielectric layer over the middle conductor plate layer, a top conductor plate layer over the third dielectric layer, the top conductor plate layer including a third plurality of sublayers, and a second passivation layer over the top conductor plate layer.

In some embodiments, the first plurality of sublayers includes a first metal nitride layer, a first metal layer over the first metal nitride layer, and a second metal nitride layer over the first metal layer. The second plurality of sublayers includes a third metal nitride layer, a second metal layer over the third metal nitride layer, and a fourth metal nitride layer over the second metal layer. The third plurality of sublayers includes a fifth metal nitride layer, a third metal layer over the fifth metal nitride layer, and a sixth metal nitride layer over the third metal layer. In some implementations, the first metal nitride layer, the second metal nitride layer, the third metal nitride layer, the fourth metal nitride layer, the fifth metal nitride layer, and the sixth metal nitride layer include titanium nitride and the first metal layer, the second metal layer, and the third metal layer include titanium. In some instances, the first metal nitride layer, the second metal nitride layer, the third metal nitride layer, the fourth metal nitride layer, the fifth metal nitride layer, and the sixth metal nitride layer include tantalum nitride and the first metal layer, the second metal layer, and the third metal layer include tantalum. In some embodiments, the first metal nitride layer and the third metal nitride layer include a thickness between about 20 nm and about 40 nm. In some embodiments, the second dielectric layer and the third dielectric layer include hafnium oxide, zirconium oxide, tantalum oxide, or aluminum oxide. In some implementations, the semiconductor device may further include a conductive feature extending through the top conductor plate layer, the third dielectric layer, the second dielectric layer, the bottom conductor plate layer, and the first dielectric layer and the conductive feature electrically couples the top conductor plate layer and the bottom conductor plate layer to the conductive feature.

Another aspect of the present disclosure involves a metal-insulator-metal structure. The metal-insulator-metal structure includes a bottom conductor plate layer, a first dielectric layer over the bottom conductor plate layer, a middle conductor plate layer, a third dielectric layer over the middle conductor plate layer, and a top conductor plate layer over the third dielectric layer. Each of the bottom conductor plate layer, the middle conductor plate layer, and the top conductor plate layer includes a first conductive barrier layer, a second conductive barrier layer, and a metal layer.

In some embodiments, the metal layer is sandwiched between the first conductive barrier layer and the second conductive barrier layer. In some embodiments, a conductivity of the metal layer is greater than a conductivity of the first conductive barrier layer and the second conductive barrier layer. In some implementations, the first conductive barrier layer and the second conductive barrier layer include a first thickness and the metal layer includes a second thickness greater than the first thickness. In some instances, the first thickness is between about 20 nm and about 40 nm. In some embodiments, the first conductive barrier layer and the second conductive barrier layer include titanium nitride and the metal layer includes titanium. In some implementations, the first conductive barrier layer and the second conductive barrier layer include tantalum nitride and the metal layer includes tantalum.

Still another aspect of the present disclosure involves a method. The method includes providing a workpiece including a conductive feature, depositing a first insulation layer over the conductive feature, forming a multilayer bottom conductor plate layer over the first insulation layer, depositing a first dielectric layer over the multilayer bottom conductor plate layer, forming a multilayer middle conductor plate layer over the first dielectric layer, depositing a second dielectric layer over the multilayer middle conductor plate layer, forming a multilayer top conductor plate layer over the second dielectric layer, and depositing a second insulation layer over the multilayer top conductor plate layer.

In some embodiments, the forming of the multilayer bottom conductor plate layer includes depositing a first metal nitride layer over the first insulation layer, depositing a first metal layer over the first metal nitride layer, and depositing a second metal nitride layer over the first metal layer. In some implementations, the depositing of the first metal nitride layer, the depositing of the first metal layer, and the depositing of the second metal nitride layer are performed in-situ in the same process chamber. In some embodiments, the forming of the multilayer middle conductor plate layer includes depositing a third metal nitride layer over the first dielectric layer, depositing a second metal layer over the third metal nitride layer, and depositing a fourth metal nitride layer over the second metal layer. In some instances, the forming of the multilayer top conductor plate layer includes depositing a fifth metal nitride layer over the second dielectric layer, depositing a third metal layer over the fifth metal nitride layer, and depositing a sixth metal nitride layer over the second metal layer. In some instances, the method may further include forming an opening through the second insulation layer, the sixth metal nitride layer, the third metal layer, the fifth metal nitride layer, the second dielectric layer, the first dielectric layer, the second metal nitride layer, the first metal layer, the first metal nitride layer, and the first insulation layer to expose the conductive feature, and forming a conductive feature in the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    an etch stop layer comprising a first thickness between about 45 nm and about 55 nm;
    a first dielectric layer on the etch stop layer and comprising a second thickness between about 800 nm and about 1000 nm;
    a contact feature disposed completely in the first dielectric layer and on the etch stop layer;
    a first passivation layer over the contact feature;
    a bottom conductor plate layer over the first passivation layer, the bottom conductor plate layer comprising a first plurality of sublayers;
    a second dielectric layer over the bottom conductor plate layer;
    a middle conductor plate layer over the second dielectric layer, the middle conductor plate layer comprising a second plurality of sublayers;
    a third dielectric layer over the middle conductor plate layer;
    a top conductor plate layer over the third dielectric layer, the top conductor plate layer comprising a third plurality of sublayers;
    a second passivation layer over the top conductor plate layer; and
    a first conductive feature that include a via portion and a top portion disposed over the via portion, wherein the via portion is in direct contact with the contact feature, and a portion of the top portion is disposed over a top surface of the second passivation layer.

2. The semiconductor device of claim 1,
wherein the first plurality of sublayers comprises:
  a first metal nitride layer,
  a first metal layer over the first metal nitride layer, and
  a second metal nitride layer over the first metal layer,
wherein the second plurality of sublayers comprises:
  a third metal nitride layer,
  a second metal layer over the third metal nitride layer, and
  a fourth metal nitride layer over the second metal layer,
wherein the third plurality of sublayers comprises:
  a fifth metal nitride layer,
  a third metal layer over the fifth metal nitride layer, and
  a sixth metal nitride layer over the third metal layer.

3. The semiconductor device of claim 2,
wherein the first metal nitride layer, the second metal nitride layer, the third metal nitride layer, the fourth metal nitride layer, the fifth metal nitride layer, and the sixth metal nitride layer comprise titanium nitride,
wherein the first metal layer, the second metal layer, and the third metal layer comprise titanium.

4. The semiconductor device of claim 2,
wherein the first metal nitride layer, the second metal nitride layer, the third metal nitride layer, the fourth metal nitride layer, the fifth metal nitride layer, and the sixth metal nitride layer comprise tantalum nitride,
wherein the first metal layer, the second metal layer, and the third metal layer comprise tantalum.

5. The semiconductor device of claim 2,
wherein the first metal nitride layer and the third metal nitride layer comprise a thickness between about 20 nm and about 40 nm.

6. The semiconductor device of claim 1, wherein the second dielectric layer and the third dielectric layer comprise hafnium oxide, zirconium oxide, tantalum oxide, or aluminum oxide.

7. The semiconductor device of claim 1, further comprising:
  a barrier layer disposed between the first conductive feature and the second passivation layer, wherein the top portion is spaced apart from the top surface of the second passivation layer by the barrier layer.

8. A metal-insulator-metal structure, comprising:
  a contact feature disposed in a bottom dielectric layer;
  a bottom passivation layer over the contact feature;
  a bottom conductor plate layer over the bottom passivation layer;
  a first dielectric layer over the bottom conductor plate layer;
  a middle conductor plate layer;
  a second dielectric layer over the middle conductor plate layer;
  a top conductor plate layer over the second dielectric layer;
  a passivation layer over the top conductor plate layer; and
  a conductive feature that includes a via portion and a top portion disposed over the via portion,
  wherein a portion of the top portion is disposed over a top surface of the passivation layer,
  wherein the top portion is spaced apart from a top surface of the passivation layer by a barrier layer,
  wherein the top portion extends through the bottom passivation layer to contact the contact feature,
  wherein a sidewall of the top portion is in contact with sidewalls of the middle conductor plate layer and the top conductor plate layer,
  wherein each of the bottom conductor plate layer, the middle conductor plate layer, and the top conductor plate layer comprises a first conductive barrier layer, a second conductive barrier layer, and a metal layer.

9. The metal-insulator-metal structure of claim 8, wherein the metal layer is sandwiched between the first conductive barrier layer and the second conductive barrier layer.

10. The metal-insulator-metal structure of claim 8, wherein a conductivity of the metal layer is greater than a conductivity of the first conductive barrier layer and the second conductive barrier layer.

11. The metal-insulator-metal structure of claim 8,
wherein the first conductive barrier layer and the second conductive barrier layer comprise a first thickness,
wherein the metal layer comprises a second thickness greater than the first thickness.

12. The metal-insulator-metal structure of claim 11, wherein the first thickness is between about 20 nm and about 40 nm.

13. The metal-insulator-metal structure of claim 8,
wherein the first conductive barrier layer and the second conductive barrier layer comprise titanium nitride,
wherein the metal layer comprises titanium.

14. The metal-insulator-metal structure of claim 8,
wherein the first conductive barrier layer and the second conductive barrier layer comprise tantalum nitride,
wherein the metal layer comprises tantalum.

15. A method, comprising:
  providing a workpiece comprising a contact feature;
  depositing a first insulation layer over the contact feature;
  forming a multilayer bottom conductor plate layer over the first insulation layer;
  patterning the multilayer bottom conductor plate layer;
  passivating sidewalls of the patterned multilayer bottom conductor plate layer;
  depositing a first dielectric layer over the patterned multilayer bottom conductor plate layer;
  forming a multilayer middle conductor plate layer over the first dielectric layer;
  patterning the multilayer middle conductor plate layer;
  passivating sidewalls of the patterned multilayer middle conductor plate layer;
  depositing a second dielectric layer over the patterned multilayer middle conductor plate layer;
  forming a multilayer top conductor plate layer over the second dielectric layer;
  patterning the multilayer top conductor plate layer;
  passivating sidewalls of the patterned multilayer top conductor plate layer;
  depositing a second insulation layer over the patterned multilayer top conductor plate layer;
  forming a first opening through the second insulation layer, the multilayer top conductor plate layer, the second dielectric layer, the multilayer middle conductor plate layer, the first dielectric layer, the first insulation layer to expose sidewalls of the multilayer top conductor plate layer, sidewalls of the multilayer middle conductor plate layer, and a top surface of the contact feature;
  depositing a metal fill layer over the first opening and the second insulation layer; and
  patterning the metal fill layer to form a conductive feature that includes a via portion disposed in the first opening, and a top portion disposed over the via portion and a top surface of the second insulation layer.

16. The method of claim 15, wherein the forming of the multilayer bottom conductor plate layer comprises:
    depositing a first metal nitride layer over the first insulation layer,
    depositing a first metal layer over the first metal nitride layer, and
    depositing a second metal nitride layer over the first metal layer.

17. The method of claim 16, wherein the depositing of the first metal nitride layer, the depositing of the first metal layer, and the depositing of the second metal nitride layer are performed in-situ in the same process chamber.

18. The method of claim 16, wherein the forming of the multilayer middle conductor plate layer comprises:
    depositing a third metal nitride layer over the first dielectric layer,
    depositing a second metal layer over the third metal nitride layer, and
    depositing a fourth metal nitride layer over the second metal layer.

19. The method of claim 18, wherein the forming of the multilayer top conductor plate layer comprises:
    depositing a fifth metal nitride layer over the second dielectric layer,
    depositing a third metal layer over the fifth metal nitride layer, and
    depositing a sixth metal nitride layer over the second metal layer.

20. The method of claim 19, further comprising:
    before the depositing of the metal fill layer, depositing a barrier layer over the first opening and the second insulation layer,
    wherein the patterning comprises patterning the barrier layer.

* * * * *